United States Patent
Warin et al.

(10) Patent No.: US 8,154,282 B2
(45) Date of Patent: Apr. 10, 2012

(54) MAGNETIC FIELD-SENSITIVE COMPONENT COMPRISING A DILUTED MAGNETIC SEMICONDUCTOR, DEVICES INCORPORATING SAME AND USE METHOD

(75) Inventors: Patrick Warin, Coublevie (FR); Matthieu Jamet, Voiron (FR)

(73) Assignee: Commissariat a l'Energie Atomique, Paris (FR)

( * ) Notice: Subject to any disclaimer, the term of this patent is extended or adjusted under 35 U.S.C. 154(b) by 543 days.

(21) Appl. No.: 12/281,841

(22) PCT Filed: Mar. 7, 2007

(86) PCT No.: PCT/FR2007/000404
§ 371 (c)(1),
(2), (4) Date: Jun. 12, 2009

(87) PCT Pub. No.: WO2007/101943
PCT Pub. Date: Sep. 13, 2007

(65) Prior Publication Data
US 2009/0251139 A1    Oct. 8, 2009

(30) Foreign Application Priority Data
Mar. 7, 2006    (FR) ...................................... 06 02009

(51) Int. Cl.
*G01R 33/12*    (2006.01)
(52) U.S. Cl. .................. 324/252; 324/207.21
(58) Field of Classification Search ............. 324/207.21, 324/252
See application file for complete search history.

(56) References Cited

U.S. PATENT DOCUMENTS

| | | | |
|---|---|---|---|
| 5,089,991 | A | 2/1992 | Matthews |
| 5,314,547 | A | 5/1994 | Heremans et al. |
| 6,910,382 | B2 | 6/2005 | Tang et al. |
| 2005/0045976 | A1 | 3/2005 | Lee et al. |
| 2005/0190593 | A1 | 9/2005 | Johnson |

FOREIGN PATENT DOCUMENTS
EP    0 524 369 A    1/1993

OTHER PUBLICATIONS

International Search Report and Written Opinion for PCT/FR2007/000404 filed Mar. 7, 2007.

*Primary Examiner* — Reena Aurora
(74) *Attorney, Agent, or Firm* — Alston & Bird LLP

(57) ABSTRACT

The invention concerns a magnetic field-sensitive component, a magnetic field sensing device and a memory structure each incorporating said component, and a method for detecting a magnetic field using said component. A component according to the invention comprises: at least one diluted magnetic semiconductor, first means for generating an electric current in said semiconductor along one predetermined direction, and second means for producing a signal representing a Hall voltage transverse to said direction, and it is so designed that the semiconductor is selected from the group consisting of II/VI and IV/IV type semiconductors and comprises a zone sensitive to said field which forms all or part of a magnetic quantum well, wherein are confined current carriers incorporated by doping in the semiconductor and inducing in said well ferromagnetic exchange interactions.

28 Claims, 3 Drawing Sheets

MAGNETIC FIELD-SENSITIVE COMPONENT COMPRISING A DILUTED MAGNETIC SEMICONDUCTOR, DEVICES INCORPORATING SAME AND USE METHOD

CROSS REFERENCE TO RELATED APPLICATIONS

This application is a national stage application filed under 35 U.S.C. 371 of International Application No. PCT/FR2007/000404, filed Mar. 7, 2007, which claims priority from French patent application 06 02009, filed Mar. 7, 2006.

FIELD AND BACKGROUND OF THE INVENTION

The present invention relates to a magnetic-field-sensitive component comprising at least one diluted magnetic semiconductor, to a magnetic field sensor device and to a memory structure, each incorporating this component, and to a method of detecting a magnetic field by means of this component.

Magnetic field sensors are used in many devices, such as magnetometers, compasses, angle sensors, sensitive elements of hard disk read heads or magnetic tape readers. Various principles are used, but for most applications, such as for magnetic hard disk read heads, it is desired to obtain a higher sensitivity to low-intensity magnetic fields and/or to very localized magnetic fields.

At the present time, it is common practice to use, as magnetic field sensors, Hall-effect probes and magnetoresistive sensors (exhibiting anisotropic or giant magnetoresistance). The latter sensors are used in particular in modern hard disk read heads, where they advantageously replaced inductive read heads owing to their greater sensitivity to low-intensity magnetic fields.

Nevertheless, these magnetoresistive sensors have the drawback of being limited to a narrow range of magnetic field intensities for obtaining a high sensitivity, before the magnetization of the active layer, which is generally chosen from a soft material, saturates.

It is also known to use inductive sensors that do not have this limitation in terms of accessible field range but which can be used only for detecting variations in a magnetic field, and not the intensity of a static magnetic field.

More recently, to meet ever greater sensitivity requirements, it has been sought to develop magnetic field sensors based on tunnel magnetoresistance in order to constitute the sensitive element of hard disk read heads. However, it is predictable that the reduction in size of the magnetic bits supporting the information on hard disks, and therefore the reduction in the radiated magnetic field that can be detected by the read element, will require the search for novel sensors that are even more sensitive to these small magnetic fields.

A. D. Kent et al., J. Appl. Phys., 76, 6656 (1994) proposed in this article a novel concept of magnetic field sensor, based on measuring the Hall effect in a two-dimensional gas of charge carriers (electrons or holes) within a thin semiconductor film. In such systems, such as a thin film of a GaAs semiconductor between two AlGaAs films, the measured Hall voltage is higher the lower the carrier concentration.

Mention may also be made of the work carried out by F. Takano et al., Physica E, 12, 370 (2002) which are placed under particular conditions of a low concentration of magnetic elements and carried out at low temperature, in order to observe the quantum Hall effect in a magnetic well of a diluted CdMnTe magnetic semiconductor. It should be noted that, under these conditions, quantum Hall effect plateau response as a function of the applied magnetic field has resulted in magnetic field intensity ranges in which no variation of the Hall voltage can be detected.

A major drawback of the devices described in these documents is that they are unable to detect magnetic fields having a very low intensity and/or are highly localized in space.

Even more recently, document U.S. Pat. No. 6,910,382 has presented a magnetic field detection device, in particular for hard disk read heads, which is based on the giant planar Hall effect in diluted magnetic semiconductors. More precisely, this device is designed to detect changes in the properties of domain walls, such as changes in orientation of magnetization domains.

It should be noted that the device described in the above document is not designed to measure magnetic field intensities, but only changes in magnetic properties.

SUMMARY OF THE INVENTION

One object of the present invention is to propose a component sensitive to a magnetic field, comprising: at least one diluted magnetic semiconductor; first means, for generating an electrical current in said semiconductor in a predetermined direction; and second means, for producing a signal representative of a Hall voltage transverse to said direction on either side of said semiconductor, which enables all the aforementioned drawbacks to be remedied by making it possible to detect magnetic fields of very low intensity and/or magnetic fields highly localized in space, with greater sensitivity than that of the prior art.

For this purpose, the component according to the invention is such that the semiconductor is chosen from the group formed by II/VI and IV/IV semiconductors and comprises a zone sensitive to said field, which zone forms all or part of a magnetic quantum well in which charge carriers are confined, said charge carriers being incorporated by doping said semiconductor and inducing ferromagnetic exchange interactions in said well causing a giant Zeeman effect, in such a way that said component is capable, directly from said signal, of detecting the presence of said field relative to a reference threshold and/or of measuring the intensity of said field independently of any reference threshold.

It should be noted that this giant Zeeman effect makes it possible to achieve very considerably greater sensitivities compared with those relating to known semiconductors. This is because the ion/charge-carrier exchange interaction, the origin of the giant Zeeman effect, is several orders of magnitude greater than the interaction that induces the conventional Zeeman effect.

It should also be noted that this component according to the invention eliminates the aforementioned limitation inherent in magnetoresistive sensors, i.e. the narrow range of magnetic field intensities in which a high sensitivity is obtained.

Indeed, one substantial advantage of the component according to the invention is that the magnetization saturation of the active film occurs only with magnetic fields of very high intensity, thus considerably extending the range of magnetic fields accessible to measurement, compared with that procured by magnetoresistive sensors.

Furthermore, it should be noted that this component according to the invention does not have the aforementioned drawback in relation to inductive sensors, due to the fact that it enables static magnetic fields to be measured, even highly localized ones, and again with a high sensitivity.

Said diluted magnetic semiconductor can either be n-doped or p-doped and advantageously it incorporates at least one magnetic dopant element in an atomic fraction of between 0.1% and 10%.

Preferably, said magnetic dopant element is chosen from the group consisting of manganese, iron, cobalt and chromium.

According to exemplary embodiments of the invention, said diluted magnetic semiconductor is based on a II/VI semiconductor chosen from the group consisting of CdTe, ZnTe and ZnO semiconductors or based on a IV/IV semiconductor chosen from the group consisting of Si and Ge semiconductors.

As a preference, said diluted magnetic semiconductor is based on a II/VI semiconductor and even more preferably on a CdMnTe semiconductor, i.e. one that contains manganese as magnetic dopant element.

Said diluted magnetic semiconductor may furthermore incorporate at least one other dopant element which may for example be aluminum (n-type doping) or nitrogen (p-type doping), in particular for a CdMnTe semiconductor.

In general, said magnetic element may be incorporated into said semiconductor by any method suitable for diluting it.

Preferably, this magnetic dopant element is introduced during the semiconductor growth step, for example by codepositing this magnetic element simultaneously with the constituents of the semiconductor.

According to another feature of the invention, said sensitive zone may advantageously lie within a thin film of said semiconductor, two barriers being applied to the faces of said thin film, which barriers are designed to confine said charge carriers and each have a wider bandgap than that of said semiconductor (typically a few hundred meV), said sensitive zone being bounded by an edge perpendicular to said thin film.

This barrier effect may be obtained by modulating the doping of said semiconductor.

According to another feature of the invention, said component includes means for electrically connecting said semiconductor to said first and second means, said connection means being placed locally outside but in the immediate vicinity of said sensitive zone.

In one way of implementing the invention, the structure of said component consists of the following arrangement of II/VI semiconductor-based layers:

$Cd_{0.78}Mg_{0.22}Te$ (25 nm)/$Cd_{0.91}Mn_{0.09}Te$ (10 nm)/$Cd_{0.78}Mg_{0.22}Te$ (25 nm)/$Cd_{0.96}Zn_{0.04}Te$ ((001) oriented substrate).

In the latter case, after bringing the specimen to the atmosphere, the surface oxidation creates acceptor states in the upper $Cd_{0.78}Mg_{0.22}Te$ barrier. In this way, the hole density in the quantum well may reach about $10^{11}$ cm$^{-2}$.

The formation of a contact on the quantum well is advantageously carried out in an ultrahigh vacuum: after ion etching down to said well, a deposition of copper (double acceptor in CdTe) followed by annealing up to 200° C. enables an ohmic contact to be obtained on the quantum well serving as detector.

Advantageously, said connection means comprise at least two pairs of electrical contacts made of a metallic material, preferably based on copper, it being possible for these contacts to be obtained by local diffusion of said metallic material into said semiconductor in order to connect to said first and/or second means.

A magnetic field sensor device according to the invention, such as a magnetometer, is designed to detect the intensity of a magnetic field above a defined reference threshold and/or to measure the intensity of said field independently of any reference threshold, this device being such that it includes the component according to the invention as defined above.

A memory structure according to the invention can be used in a magnetic read head, for example for a hard disk, and it comprises at least one ferromagnetic solid-state volume which is capable of supporting at least two stable magnetization states and is located in the immediate vicinity of at least one component according to the invention for the purpose of creating therein a magnetic field detected by this component and having different intensities depending on the magnetization state of said or each volume.

According to another advantageous feature of the invention, said or each ferromagnetic volume is designed to support information and to write said information by modifying its magnetization (for example, via the application of a magnetic field or of a spin-polarized current in the structure), said second means for measuring the Hall voltage being designed to deliver measurements representative of a modification of said voltage in the sensitive zone of said component, in order to read said information via this sensitive zone.

Preferably, said or each ferromagnetic volume is located at a distance of between 5 nm and 50 nm from said sensitive zone.

According to a first embodiment of the invention, said or each ferromagnetic volume is located vertically above the sensitive zone of said well and has a magnetization perpendicular to the plane of this sensitive zone. In this case, said or each ferromagnetic volume may be of the monolayer type based on an iron/platinum alloy, or else of the multilayer type, such as having platinum/cobalt/platinum layers.

According to a second embodiment of the invention, said or each ferromagnetic volume is offset relative to the vertical through the sensitive zone of said well and has a magnetization parallel to the plane of this sensitive zone, in such a way that the leakage magnetic field of said or each volume is perpendicular to the plane of said sensitive zone.

In general, said memory structure may comprise a single ferromagnetic volume, therefore constituting the elementary cell of a solid-state magnetic memory, or else a plurality of ferromagnetic volumes distributed in one or two directions, in order to obtain a linear or matrix memory structure respectively.

Advantageously, the memory structure is of matrix type and it comprises a plurality of conducting metal lines, such as copper lines, which are designed for local application of the magnetic field needed to reverse the magnetization of a ferromagnetic volume by simultaneously applying two current pulses in two conducting lines intersecting in the immediate vicinity of said addressed ferromagnetic volume.

A method of detecting a magnetic field according to the invention is carried out by means of said component according to the invention which comprises at least one diluted magnetic semiconductor, this method comprising the generation of an electric current in said semiconductor in a predetermined direction and the production of a signal representative of a Hall voltage transverse to this direction on either side of said semiconductor.

According to the invention, this method comprises the formation, in said semiconductor, which is chosen from the group consisting of II/VI and IV/IV semiconductors, of a zone sensitive to said field forming all or part of a magnetic quantum well, so that charge carriers, incorporated into said semiconductor by doping and confined in said well, induce ferromagnetic exchange interactions, advantageously RKKY interactions (as described in T. Dietl et al., Phys. Rev. B, 55, R3347 (1997)) therein that generate a giant Zeeman effect, for detecting, with enhanced sensitivity, by applying a proportionality coefficient to said signal, the presence of the field relative to a reference threshold and/or for precisely measuring the intensity of said field independently of any reference threshold.

Preferably, this method according to the invention is carried out at an operating temperature close to the Curie temperature of said diluted magnetic semiconductor, either by appropriately selecting the semiconductor material or by adjusting this operating temperature to said Curie temperature. The term "close" denotes here "approximately equal" in the sense that the operator uses a temperature range in which the magnetic susceptibility of the semiconductor is greatly increased, said susceptibility having, as is known, a peak in the region of the Curie temperature.

Since the dependence of the Hall voltage on the applied magnetic field is also observed above the Curie temperature of the semiconductor, it should be noted that this method according to the invention has the advantage of being able to be implemented at an operating temperature which is above this Curie temperature and is therefore advantageously the ambient temperature, i.e. typically a temperature of around 20° C. to 25° C. This operating temperature may thus be equal to or greater than 293 K, and for example close to 300 K.

Above this Curie temperature, the magnetic susceptibility $\chi$ of the semiconductor, which measures the sensitivity of the component according to the invention, is proportional to $1/(T-T_c)$, in which T is the operating temperature and $T_c$ is the Curie temperature of said semiconductor.

Below $T_c$, the sensitivity of the component of the invention will depend on the susceptibility of the material used for the semiconductor.

Advantageously, the method of the invention comprises the association with said component of at least one ferromagnetic solid-state volume, which volume is capable of supporting at least two stable magnetization states and is located in the immediate vicinity of said component for the purpose of creating therein a magnetic field detected by this component and having different intensities depending on the magnetization state of said or each volume, in order to form a memory structure which can be used in a magnetic read head and comprises said component and said or each volume.

According to another feature of this method according to the invention, said or each ferromagnetic volume supports more than two information states, said states corresponding to various values of the magnetic field created in said component by reversing the magnetization of said or each volume between several states.

Advantageously, the magnetization of said or each ferromagnetic volume may be reversed by injecting a spin-polarized current from another ferromagnetic volume.

BRIEF DESCRIPTION OF THE DRAWINGS

The aforementioned features of the present invention, as well as others, will be better understood on reading the following description of several exemplary embodiments of the invention given by way of illustration but implying no limitation, said description being in conjunction with the appended drawings in which.

DETAILED DESCRIPTION

Figure 1:
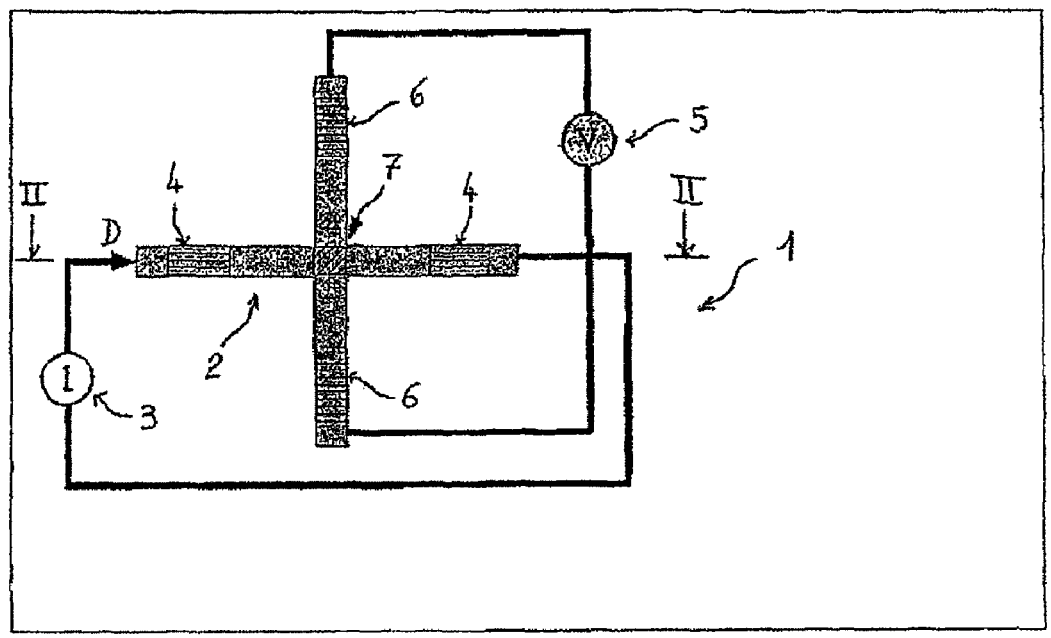
FIG. 1 is a schematic top view of a magnetic-field-sensitive component according to the invention.

The component 1 according to the invention illustrated in FIG. 1 essentially comprises:

a diluted magnetic semiconductor 2, for example a CdMnTe semiconductor (i.e. one based on cadmium and tellurium, and incorporating manganese as magnetic dopant element);

first means 3, for generating an electric current I in the semiconductor 2 in a predetermined direction D via a pair of first electrical contacts 4; and second means 5, for producing a signal representative of the Hall voltage V transverse to this direction on either side of the semiconductor 2 via another pair of electrical contacts 6.

According to the invention, the semiconductor 2 comprises a magnetic-field-sensitive zone 7 corresponding to at least part of a magnetic quantum well 8 (see FIG. 2), through which part of the current I is intended to flow, while the transverse voltage V is measured for detecting the magnetic field (whether static or not) which is applied to this well 8 or else for measuring its intensity.

The electrical contacts 4 and 6 are produced in the immediate vicinity of, but outside the sensitive zone 7 of the well 8, by diffusion of a metal, said metal being deposited on the surface of the contact regions 4 and 6 (see FIG. 2), this metal preferably being copper in the case of this CdMnTe quantum well 8.

Figure 2:
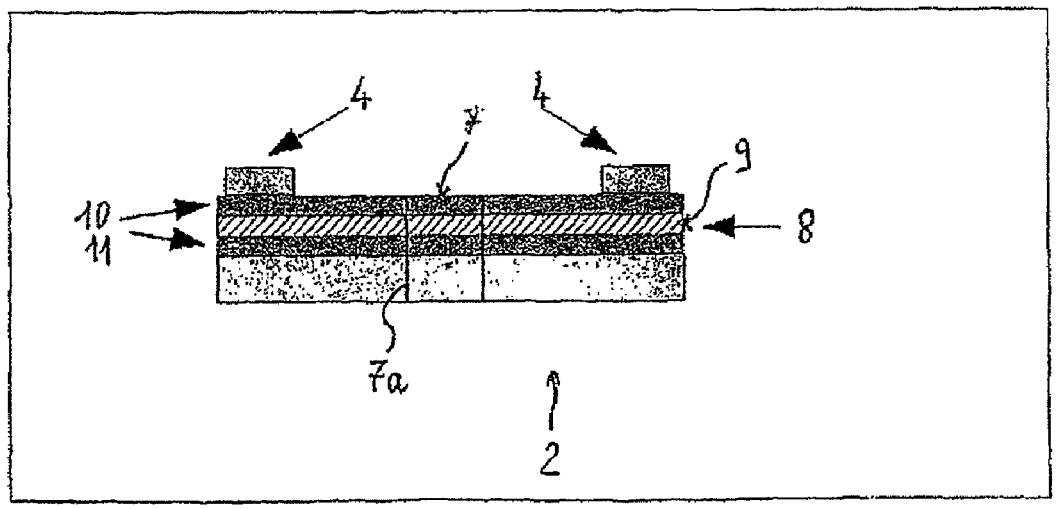
FIG. 2 is a partial view in cross section of this component in the plane II-II of FIG. 1.

In the exemplary embodiment shown in FIG. 2, the semiconductor 2 is in the form of a thin film 9, located between two isolating barriers 10 and 11 that have a wider bandgap than that of the semiconductor 2 and make it possible to confine, within the latter, the charge carriers provided by the magnetic dopant element, such as manganese. This barrier effect is obtained for example by modulating the doping of the semiconductor 2. The sensitive zone 7 itself is bounded by a vertical lateral edge 7a perpendicular to the thin film 9 and to the barriers 10 and 11.

To produce the semiconductor 2, the magnetic dopant element was for example introduced during the growth of the semiconductor 2, for example by codepositing this magnetic element simultaneously with the other constituents of the semiconductor 2.

The semiconductor thus obtained is a "diluted magnetic" semiconductor wherein the charge carriers coming from the magnetic dopant element allow ferromagnetic exchange interaction, for example RKKY interaction, between the magnetic atoms. This interaction is the origin of a giant Zeeman effect enabling magnetic-field detection and measurement sensitivities to be achieved that are very considerably increased in comparison with those relating to known semiconductors.

Figure 3:
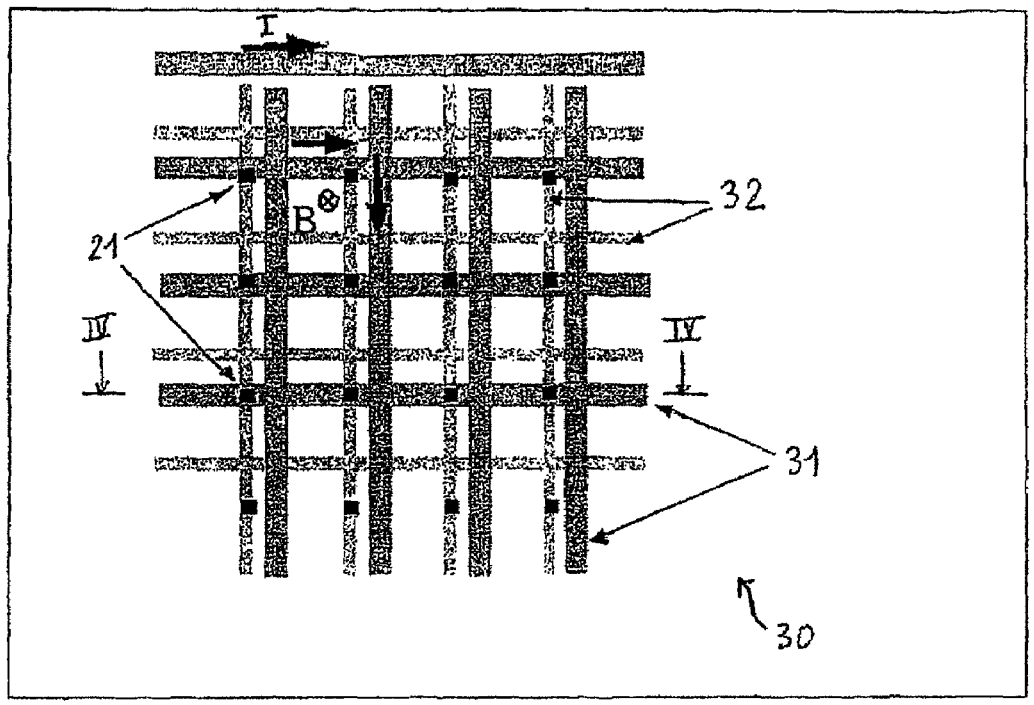
FIG. 3 is a schematic top view of a matrix memory structure according to the invention incorporating said component.
Figure 4:
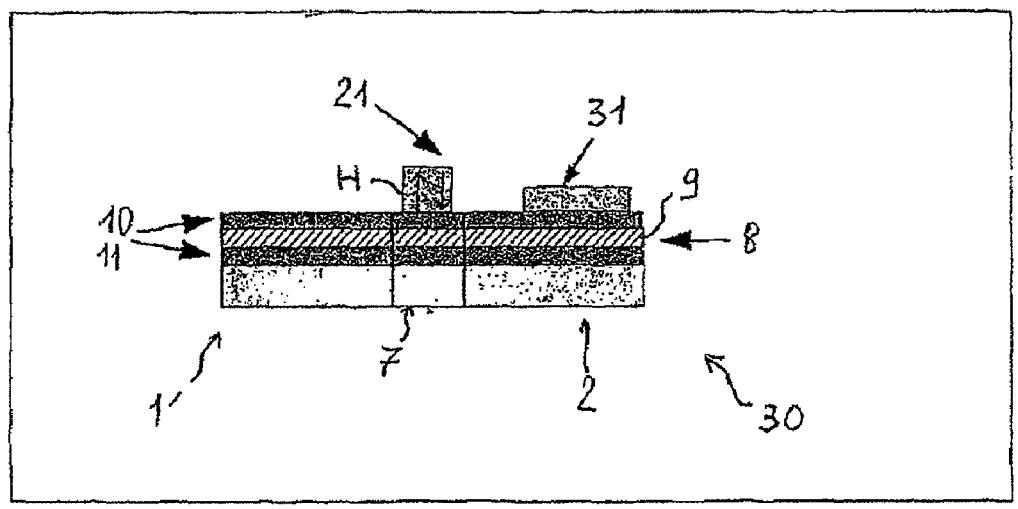
FIG. 4 is a partial view in cross section in the plane IV-IV of FIG. 3 of the memory structure illustrated therein.

FIGS. 3 and 4 illustrate an advantageous use of a variant 1' of the component 1 according to the invention, in order to form a matrix-type solid-state memory structure 30 through which the electric current I flows, said structure enabling a large number of elementary bits to be stored via the component 1' that it incorporates.

The memory structure 30 comprises, in addition to this component 1', ferromagnetic volumes 21 (only one can be seen in FIG. 4) for information support, each volume being capable of supporting at least two stable magnetization states.

Each ferromagnetic volume 12 is positioned close to the quantum well 8, preferably at a distance of between 5 nm and 50 nm, so as to create therein a magnetic field that differs according to its magnetization state.

In the exemplary embodiment shown in FIG. 4, each ferromagnetic volume 21 is magnetized perpendicular to the plane of the quantum well 8 (see the arrows H in FIG. 4), and this volume 21 is for example made of a material such as a chemically ordered Fe—Pt alloy with its c-axis perpendicular, thereby giving it a high perpendicular magnetic anisotropy. As a variant, each volume 21 may be formed via a multilayer structure, such as Pt/Co/Pt, in which, for cobalt thicknesses of between 0.4 nm and 1 nm, the magnetization is perpendicular.

The matrix memory structure 30 shown in FIG. 3 includes, in this example, copper lines designed for locally applying the magnetic field B necessary to reverse the magnetization of a ferromagnetic volume 21. This effect is obtained by simultaneously applying two current pulses in the two copper lines that intersect close to each addressed ferromagnetic volume 21, at a distance of the order of the size of the volume 21 whose magnetization is to be reversed.

Visible in the top view shown in FIG. 3 are tracks 31 for reading the information via the sensitive zone 7 of the well 8 and tracks 32 for writing this information via the ferromagnetic volumes 21 (these tracks 31 and 32 are called "bit lines" and "word lines" respectively). Each ferromagnetic volume 21 is designed to write on the tracks 32 via a modification of its magnetization, for example by applying a magnetic field or a spin-polarized current in the structure 30.

Figure 5:
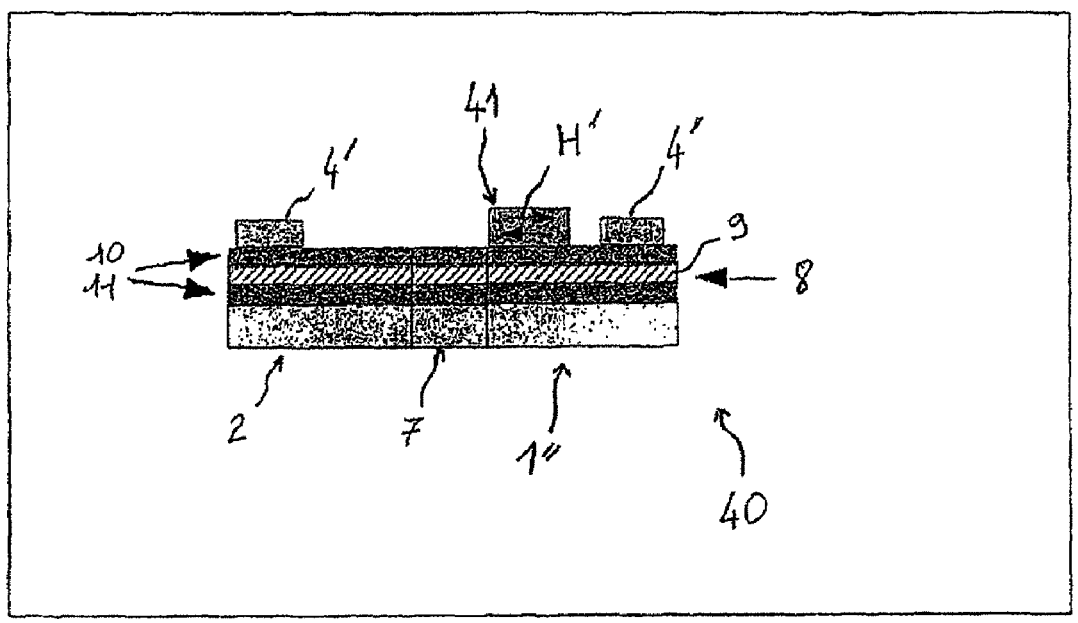
FIG. 5 is a partial view in cross section in the plane V-V of FIG. 3 of a variant of this memory structure.

FIG. 5 illustrates an alternative embodiment of the memory structure 30 of FIG. 4, in which the elementary memory element 40 represented therein comprises, in addition to a component 1" according to the invention, a ferromagnetic volume 41 in which the magnetization is chosen to be parallel to the plane of the quantum well 8 (see arrows H' in FIG. 5). In this case, the volume 41 is offset with respect to the vertical through the sensitive zone 7 of the well 8 so as to create, via the contacts 4', a magnetic field in said well with a perpendicular component.

What is claimed is:

1. A component sensitive to a magnetic field, comprising:
at least one diluted magnetic semiconductor;
first means, for generating an electrical current in said semiconductor in a predetermined direction; and
second means, for producing a signal representative of a Hall voltage transverse to said direction on either side of said semiconductor,
characterized in that said semiconductor is chosen from the group formed by II/VI and IV/IV semiconductors and comprises a zone sensitive to said field, which zone forms all or part of a magnetic quantum well in which charge carriers are confined, said charge carriers being incorporated by doping said semiconductor and inducing ferromagnetic exchange interactions in said well in such a way that said component is capable, directly from said signal, of detecting the presence of said field relative to a reference threshold and/or of measuring the intensity of said field independently of any reference threshold.

2. The component as claimed in claim 1, characterized in that said sensitive zone lies within a thin film of said semiconductor, two barriers being applied to the faces of said thin film, which barriers are designed to confine said charge carriers and each have a wider bandgap than that of said semiconductor, said sensitive zone being bounded by an edge perpendicular to said thin film.

3. The component according to claim 1, further comprising means for electrically connecting said semiconductor to said first and second means, said connection means being placed locally outside said sensitive zone but in the immediate vicinity of the latter.

4. The component as claimed in claim 3, characterized in that said connection means comprise at least two pairs of electrical contacts made of a metallic material, said contacts being obtained by local diffusion of said metallic material into said semiconductor for connection to said first and/or said second means.

5. The component as claimed in claim 4, characterized in that said diluted magnetic semiconductor is a CdMnTe semiconductor containing manganese as magnetic dopant element and in that said electrical contacts are based on copper.

6. The component as claimed in claim 5, characterized in that said semiconductor furthermore incorporates at least one other dopant element selected from the group consisting of aluminum and nitrogen.

7. The component as claimed in claim 1, characterized in that said semiconductor incorporates at least one magnetic dopant element in an atomic fraction of between 0.1% and 10%.

8. The component as claimed in claim 7, characterized in that said magnetic dopant element is selected from the group consisting of manganese, iron, cobalt and chromium.

9. The component claimed in claim 1, characterized in that said diluted magnetic semiconductor is based on a II/VI semiconductor chosen from the group consisting of CdTe, ZnTe and ZnO semiconductors.

10. The component as claimed in claim 1, characterized in that said diluted magnetic semiconductor is based on a IV/IV semiconductor chosen from the group consisting of Si and Ge semiconductors.

11. A magnetic field sensor device, such as a magnetometer, said device being designed to detect the intensity of a magnetic field above a defined reference threshold and/or to measure the intensity of said field independently of any reference threshold, characterized in that it includes a component as defined in claim 1.

12. A memory structure that can be used in a magnetic read head, comprising at least one ferromagnetic solid-state volume which is capable of supporting at least two stable magnetization states and is located in the immediate vicinity of at least one magnetic-field-sensitive component for the purpose of creating therein a magnetic field detected by said component and having different intensities depending on the magnetization state of said or each volume, characterized in that said component is as defined in claim 1.

13. The memory structure as claimed in claim 12, characterized in that said or each ferromagnetic volume is designed to support information and to write said information by modifying its magnetization, said second means for measuring Hall voltage and being designed to deliver measurements representative of a modification of said voltage in the sensitive zone of said component, in order to read said information via this sensitive zone.

14. The memory structure as claimed in claim 12, characterized in that said or each ferromagnetic volume is located at a distance of between 5 nm and 50 nm from said sensitive zone.

15. The memory structure as claimed in claim 12, characterized in that said or each ferromagnetic volume is located vertically above said sensitive zone and has a magnetization perpendicular to the plane of this sensitive zone.

16. The memory structure as claimed in claim 15, characterized in that said or each ferromagnetic volume is of the monolayer type based on an iron/platinum alloy.

17. The memory structure as claimed in claim 15, characterized in that said or each ferromagnetic volume is of the multilayer type.

18. The memory structure as claimed in claim 12, characterized in that said or each ferromagnetic volume is offset relative to the vertical through said sensitive zone and has a magnetization parallel to the plane of this sensitive zone, in such a way that the leakage magnetic field of said or each volume is perpendicular to the plane of said sensitive zone.

19. The memory structure as claimed in claim 12, characterized in that it comprises a plurality of said ferromagnetic volumes distributed in one or two directions, in order to obtain a linear or matrix memory structure respectively.

20. The memory structure of matrix type as claimed in claim 19, characterized in that it comprises a plurality of conducting metal lines, which are designed for local application of the magnetic field needed to reverse the magnetization of a ferromagnetic volume by simultaneously applying two current pulses in two conducting lines intersecting in the immediate vicinity of said addressed ferromagnetic volume.

21. A method of detecting a magnetic field by means of a component sensitive to said field, which comprises at least one diluted magnetic semiconductor, this method comprising the generation of an electric current in said semiconductor in a predetermined direction and the production of a signal representative of a Hall voltage transverse to this direction on either side of said semiconductor, characterized in that it includes the formation, in said semiconductor, which is selected from the group consisting of II/VI and IV/IV semiconductors, of a zone sensitive to said field forming all or part of a magnetic quantum well, so that charge carriers, incorporated into said semiconductor by doping and confined in said well, induce ferromagnetic exchange interactions therein that generate a giant Zeeman effect, for detecting, with enhanced sensitivity, by applying a proportionality coefficient to said signal, the presence of said field relative to a reference threshold and/or for precisely measuring the intensity of said field independently of any reference threshold.

22. The method as claimed in claim 21, characterized in that it is implemented at an operating temperature T which is approximately equal to the Curie temperature Tc of said diluted magnetic semiconductor.

23. The method as claimed in claim 21, characterized in that said operating temperature T is above the Curie temperature Tc of said diluted magnetic semiconductor.

24. The method as claimed in claim 23, characterized in that said operating temperature T is equal to or greater than 293 K.

25. The method as claimed in claim 21, characterized in that said confined charge carriers induce RKKY ferromagnetic exchange interactions in said quantum well.

26. The method as claimed in claim 21, characterized in that at least one ferromagnetic solid-state volume is associated with said component, which volume is capable of supporting at least two stable magnetization states and is located in the immediate vicinity of said component for the purpose of creating therein a magnetic field detected by this component and having different intensities depending on the magnetization state of said or each volume, in order to form a memory structure which can be used in a magnetic read head and comprises said component and said or each volume.

27. The method as claimed in claim 26, characterized in that said or each ferromagnetic volume supports more than two information states, said states corresponding to various values of the magnetic field created in said component by reversing the magnetization of said or each volume between several states.

28. The method as claimed in claim 27, characterized in that the magnetization of said or each ferromagnetic volume is reversed by injecting a spin-polarized current from another ferromagnetic volume.

* * * * *